United States Patent [19]

Blouke et al.

[11] Patent Number: 4,918,505

[45] Date of Patent: Apr. 17, 1990

[54] METHOD OF TREATING AN INTEGRATED CIRCUIT TO PROVIDE A TEMPERATURE SENSOR THAT IS INTEGRAL THEREWITH

[75] Inventors: Morley M. Blouke, Beaverton; Brian L. Corrie, Gaston, both of Oreg.

[73] Assignee: Tektronix, Inc., Beaverton, Oreg.

[21] Appl. No.: 221,069

[22] Filed: Jul. 19, 1988

[51] Int. Cl.⁴ ............................................. H01L 11/14
[52] U.S. Cl. ........................................ 357/24; 357/28; 357/30; 437/53; 437/51
[58] Field of Search ......................... 357/24, 28, 304; 437/53, 51

[56] References Cited

U.S. PATENT DOCUMENTS

| | | | |
|---|---|---|---|
| 3,697,786 | 10/1972 | Smith | 357/24 |
| 4,257,061 | 3/1981 | Chapel | 357/69 |
| 4,422,091 | 12/1983 | Liu | 357/30 |
| 4,739,382 | 4/1988 | Blouke | 357/51 |

OTHER PUBLICATIONS

D. Hodges, H. Jackson, "Analysis and Design of Digital Integrated Circuits", McGraw-Hill, 1983, p. 138.

*Primary Examiner*—Andrew J. James
*Assistant Examiner*—David Soltz
*Attorney, Agent, or Firm*—John D. Winkelman; John Smith-Hill

[57] ABSTRACT

An integrated circuit is formed in a semiconductor die having a front face and a back face, the die having at least first and second functional regions. The first functional region comprises at least one zone of p-type material and at least one zone of n-type material that meets the zone of p-type material in a p-n junction. The integrated circuit comprises connection pads connected respectively to the zone of p-type material and the zone of n-type material, whereby those zones can be connected to an external circuit. At least one of the connection pads is electrically isolated from the second functional region of the integrated circuit. The integrated circuit is treated by mounting the die on a support member and removing material of the die so as to separate the functional regions of the die from each other.

5 Claims, 1 Drawing Sheet

4,918,505

METHOD OF TREATING AN INTEGRATED CIRCUIT TO PROVIDE A TEMPERATURE SENSOR THAT IS INTEGRAL THEREWITH

BACKGROUND OF THE INVENTION

This invention relates to a method of treating an integrated circuit to provide a temperature sensor that is integral therewith.

It is conventional to operate a charge-coupled device (CCD) at a cryogenic temperature, in order to reduce dark current. When a CCD is operated at a cryogenic temperature, it is frequently desirable to monitor the temperature of the CCD die.

It is conventional to use a bipolar transistor to monitor the temperature of a CCD that is attached to a mounting block. A hole is drilled in the mounting block and a discrete bipolar transistor in a TO5 (or smaller) package is fitted in the hole. For a given base-emitter current, the base-emitter voltage of the transistor is linearly related to temperature. By supplying a constant base-emitter current and monitoring the base-emitter voltage, information regarding the temperature of the CCD can be obtained. In this type of temperature sensor, a diode may be used in lieu of a bipolar transistor.

Use of a discrete bipolar transistor or diode to monitor the temperature of a CCD in the manner described above is subject to disadvantage, because the temperature sensed by the transistor or diode is the temperature of the mounting block, not the temperature the CCD die.

The temperature of a CCD die may be monitored by use of a polysilicon resistor formed on the die during fabrication of the CCD. The resistor is provided with bonding pads for connection to an external circuit that monitors the resistance of the resistor. A disadvantage of this technique is that temperature-sensing resistors are not generally as sensitive to temperature as bipolar transistors or diodes.

SUMMARY OF THE INVENTION

A preferred embodiment of the present invention in a first aspect is a method of treating an integrated circuit formed in a semiconductor die having a front face and a back face, the die having at least first and second distinct functional regions. The first functional region comprises at least one zone of p-type material and at least one zone of n-type material that meets the zone of p-type material in a p-n junction. The integrated circuit also comprises connecting pads connected respectively to the zone of p-type material and the zone of n-type material for connecting those zones to an external circuit. At least one of the connecting pads is electrically isolated from the second functional region of the integrated circuit. The method comprises the steps of mounting the die on a support member, and removing material of the die so as to separate the functional regions of the die from each other.

A preferred embodiment of the present invention in its second aspect is in integrated circuit that comprises a support member and a semiconductor die that has front and back faces and is attached at one of its faces to the support member. The die has at least first and second functional regions that are electrically isolated from each other. The first functional region comprises at least one zone of p-type material and at least one zone of n-type material that meets the zone of p-type material in a p-n junction. The integrated circuit also comprises connection pads that are connected respectively to the zone of p-type material and the zone of n-type material, for connecting those zones to an external circuit.

A preferred embodiment of the present invention in a third aspect is an integrated circuit which comprises a semiconductor die having at least first and second functional regions, the first functional region comprising at least one zone of p-type material and at least one zone of n-type material that meets the zone of p-type material in a p-n junction. Connections pads are connected respectively to the zone of p-type material and the zone of n-type material for connecting those zones to an external circuit. At least one of the connection pads is electrically isolated from the second functional region of the integrated circuit.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
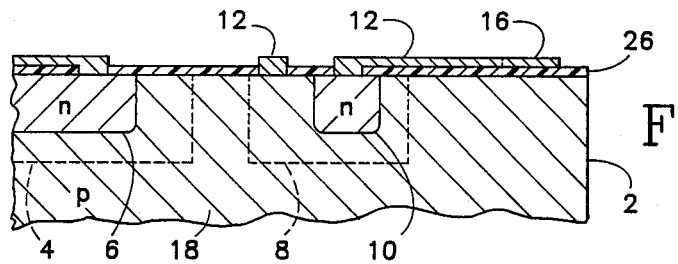
FIG. 1 is an enlarged partial sectional view of a partially-fabricated CCD, taken on the line I—I of FIG. 3.
Figure 2:
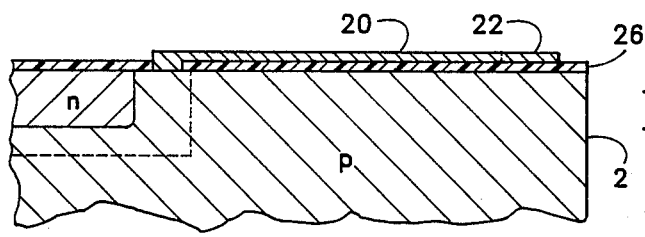
FIG. 2 is an enlarged partial sectional view of the partially-fabricated CCD, taken on the line II—II of FIG. 3.
Figure 3:
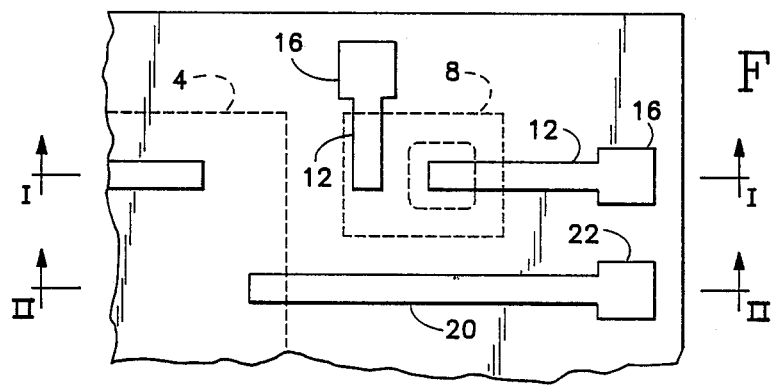
FIG. 3 is a top-plan view of the partially-fabricated CCD.

FIG. 1 illustrates a silicon integrated circuit die 2 that has been processed using conventional MOS technology, and comprises a main functional region 4, which includes a p-n junction 6, and an auxiliary region 8. The auxiliary region contains a p-n junction 10, which was formed concurrently with the junction 6. Since the die is monocrystalline, the crystal planes of the auxiliary region 8 are parallel to or coincide with the corresponding planes of the region 4. Metal interconnect strips 12 are connected respectively to the n-type zone and the p-type zone of the auxiliary region 8. As shown in FIG. 3, the strips 12 terminate in respective bonding pads 16. A metal interconnect strip 20 (FIGS. 2 and 3) is connected to the substrate 18 at a location within the boundary of the main functional region 4 and terminates in a bonding pad 22. Other zones (not shown) of the main functional region are connected to other bonding pads (not shown). The interconnect strips and the bonding pads lie on top of a silicon dioxide layer 26. A polysilicon gate electrode structure (not shown) overlies the layer 26 where it covers the main functional region 4 of the die. The region 4 of the die and the gate electrode structure together constitute a CCD.

A layer 30 of high silica borosilicate glass is formed on top of the front surface of the die (the surface through which the die is processed), and the die is thinned from its back surface to a thickness of about 10–20 μm. The borosilicate glass, which bonds firmly to the metal interconnect strips and bonding pads as well as to the silicon dioxide layer, reinforces the thinned die. The use of borosilicate glass as a reinforcing material for thinned CCDs is described in co-pending patent application Ser. No. 07/018,832 filed Feb. 24, 1987. Thinning of the die allows the CCD to be used as an imager with back surface illumination.

Figure 4:
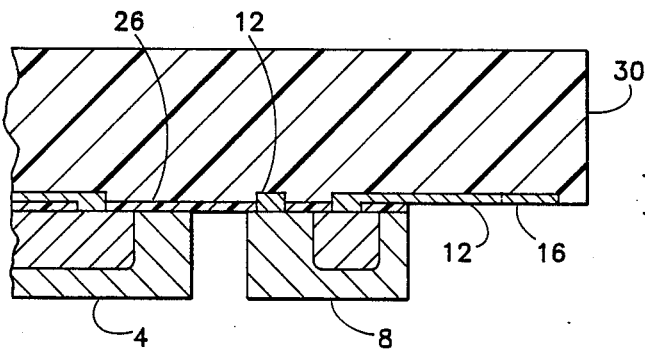
FIG. 4 is a view similar to FIG. 1 but taken at a later stage in fabrication of the CCD.

The die is selectively etched from its back surface in order to remove die material between the regions 4 and 8, in the manner described in co-pending patent application Ser. No. 07/114,884, filed Oct. 29, 1987, now U.S. Pat. No. 4,892,842 the disclosure of which is hereby incorporated by reference herein. The silicon dioxide is removed where it covers the bonding pads, and in this manner the bonding pads are exposed. Thus, the auxiliary region 8 is isolated from the main functional region 4, as shown in FIG. 4. The p-n junction within the region 8 results in the region 8 constituting a diode. The anode and cathode of the diode are connected to respective bonding pads. The thinned die is attached through the support layer 30 to a mounting block. The diode formed in the region 8 is used for sensing temperature by supplying a constant current to its cathode and measuring the voltage developed across its p-n junction. Since the anode of the diode is isolated from the substrate 18 of the CCD, substrate currents do not flow between the regions 4 and 8.

By use of a diode fabricated on the same die as the CCD, it is possible to sense the temperature at a location that is very close to the active area of the CCD. The electrical and physical isolation of the diode from the CCD ensures that operation of the CCD does not result in spurious temperature indications and that the diode does not affect operation of the CCD. The fabrication of the diode does not involve any manufacturing steps beyond those required for fabrication of the CCD.

It will be appreciated that the present invention is not restricted to the particular embodiment that has been described, and that variations may be made therein without departing from the scope of the invention as defined in the appended claims and equivalents thereof. For example, the invention is not restricted to use of a single diode, since multiple diodes, at different locations about the functional region 4, may be formed. Moreover, the invention is not restricted to use of diodes as temperature sensing elements, and bipolar transistors may be used instead. Use of bipolar transistors would involve one more implantation than does use of diodes, but this is not a significant disadvantage since the conventional method of fabricating a CCD involves multiple implantations of impurities that provide different conductivity types. The invention is not restricted to the main functional region of the die being part of a CCD. The regions 4 and 8 need not be isolated by etching from the back face of the die, since a trench isolation may be effected from the front face.

We claim:

1. A method of treating an integrated circuit formed in a semiconductor die having a front face and a back face, the die having at least first and second functional regions, the first functional region being a temperature sensor that senses the temperature of the integrated circuit and comprises at least one zone of p-type material and at least one zone of n-type material that meets the zone of p-type material in a p-n junction, and the second functional region being a charge-coupled device and the integrated circuit comprising connection pads connected respectively to said zone of p-type material and said zone of n-type material, whereby those zones can be connected to an external circuit, at least one of the connection pads being electrically isolated from the second functional region of the integrated circuit, and the method comprising the steps of:

attaching the die to a support member, the support member being in confronting relationship with the front face of the die and being substantially coextensive therewith, thinning the die by way of its back face, and removing material of the die by way of its back face so as to separate the functional regions of the die from each other while each remains attached to the support member.

2. A method according to claim 1, wherein the step of removing material of the die comprises selectively etching the die by way of its back face.

3. An integrated circuit comprising:

a support member, a thinned semiconductor die that has front and back faces, the support member being attached to the die in confronting relationship with the front face of the die and being substantially coextensive therewith, the die having at least first and second functional regions that are electrically isolated from each other, the first and second functional regions each comprising at least one zone of p-type material and at least one zone of n-type material that meets the zone of p-type material in a p-n junction, and the second functional region comprising part of a charge-coupled device, and at least first and second connection pads that are connected respectively to a zone of p-type material and a zone of n-type material of the first functional region.

4. An integrated circuit according to claim 3, wherein the first functional region is a temperature sensor, said sensor sensing the temperature of said support member and the second functional region.

5. An integrated circuit comprising:

a support member, a thinned semiconductor die that has front and back faces, the support member being attached to the die in confronting relationship with the front face of the die and being substantially coextensive therewith, the die having at least first and second functional regions that are electrically isolated from each other, the first functional region being a temperature sensor that senses the temperature of the support member and the second functional region and comprising at least one zone of p-type material and at least one zone of n-type material that meets the zone of p-type material in a p-n junction, and the second functional region being a charge-coupled device, and at least first and second connection pads that are connected respectively to the zone of p-type material and the zone of n-type material.

* * * * *